United States Patent [19]
Kim

[11] Patent Number: 5,633,579
[45] Date of Patent: May 27, 1997

[54] BOOST CONVERTER USING AN ENERGY REPRODUCING SNUBBER CIRCUIT

[75] Inventor: Marn G. Kim, Seoul, Rep. of Korea

[73] Assignee: Korea Telecommunication Authority, Rep. of Korea

[21] Appl. No.: 505,406

[22] Filed: Jul. 21, 1995

[30] Foreign Application Priority Data

Jul. 21, 1994 [KR] Rep. of Korea ............... 1994-17664

[51] Int. Cl.$^6$ ..................................... G05F 1/10
[52] U.S. Cl. .................. 323/222; 363/56; 323/262
[58] Field of Search ................ 323/222, 262, 323/282; 363/50, 56, 59, 60

[56] References Cited

U.S. PATENT DOCUMENTS

| | | | |
|---|---|---|---|
| 4,930,061 | 5/1990 | Slack et al. | 363/44 |
| 5,343,140 | 8/1994 | Gegner | 323/222 |
| 5,486,752 | 1/1996 | Hua et al. | 323/222 |
| 5,532,919 | 7/1996 | Gegner | 363/124 |

OTHER PUBLICATIONS

"Novel Zero–Voltage–Transition PWM Converters", Guichao Hau, et al., IEEE, Mar. 1992, pp. 55–61.

*Primary Examiner*—Peter S. Wong
*Assistant Examiner*—Shawn Riley
*Attorney, Agent, or Firm*—Merchant, Gould, Smith, Edell, Welter & Schmidt

[57] ABSTRACT

Disclosed is a boost converter using a stress energy reproducing snubber circuit, the converter comprising a first inductor connected between one terminal of an input portion and a first connection point; a first diode connected between said first connection point and one terminal of an output portion; and a switching device connected between said first connection point and the other terminal of said input portion, the other terminal of said input portion being connected to the other terminal of said output portion, and further comprising a second inductor connected between said first connection point and an anode of said first diode; a capacitor connected between said first connection point and a second connection point; a second diode having an anode connected to said second connection point and a cathode connected to a cathode of said first diode; and a third inductor and a third diode connected in series between said second connection point and the other terminal of said input portion, said third inductor having one terminal connected to said first second connection point and the other terminal connected to a third connection point and said third diode having a cathode connected to said third connection point and an anode connected to the other terminal of said input portion. The boost converter is capable of absorbing a stress energy occurring upon a switching device to be switched and reducing the absorbed stress energy through an LC resonance circuit. Therefore, an efficiency of the boost converter can be significantly improved.

3 Claims, 8 Drawing Sheets

BOOST CONVERTER USING AN ENERGY REPRODUCING SNUBBER CIRCUIT

BACKGROUND OF THE INVENTION

1. Field of the Invention

The present invention relates to a boost converter which is widely used in a power converting apparatus such as a rectifier, a battery discharging circuit or the like, and more particularly to an improved boost converter using a snubber circuit capable of absorbing a stress energy occurring upon a switching device therein being switched and reproducing it through an LC resonance circuit therein.

2. Description of the Prior Art

A general boost converter, as shown in FIG. 1, comprises a first inductor 12 connected between one terminal (+) of an input portion $V_i$ for receiving an input signal and a first connection point P1, a first diode 14 connected between the first connection point P1 and one terminal (+) of an output portion $V_o$, and a switching device 13 connected between the first connection point P1 and the other terminal (−) of the input portion $V_i$, the other terminal (−) of the input portion being connected to the other terminal (−) of the output portion $V_o$.

In this boost converter, if the switching device 13 is turned on, a current signal from the input portion $V_i$ is applied to the switching device 13 through the first inductor 12 and then fed back to the negative terminal (−) of the input portion $V_i$. Thus, when the switching device 13 is conductive, a loop is formed which consists of the first inductor 12, the switching device 13 and the input portion $V_i$. As a result, the magnitude of the current passing through the first inductor 12 is increased.

If, however, the switching device 13 is turned off, the current signal from the input portion $V_i$ is applied to an anode of the first diode 14 through the first inductor 12 and then fed back to the positive terminal (+) of the output portion $V_o$. Thus, when the switching device 13 is not conductive, a loop is formed which consists of the first inductor 12, the first diode 14, the output portion $V_o$ and the input portion $V_i$. As a result, the magnitude of the current from the input portion $V_i$ is reduced.

Therefore, in order to control the output of the boost converter, it is necessary to control the ratio of ON/OFF pulse width occurring when the switching device 13 is switched. When switched, the switching device 13 suffers from an excessive stress such as an excessive current stress, or an excessive voltage stress. For this reason, the boost converter needs to have an additional circuit, i.e. a snubber circuit, so as to reduce the excessive stress caused in the switching device 13.

FIG. 2 is a circuit diagram of a prior art boost converter using a snubber circuit. Component elements having similar functions to the component elements of the general boost converter (shown in FIG. 1) are indicated by the same reference numerals, and descriptions thereof are omitted. The prior art boost converter has the same construction as that of FIG. 1 except that it further comprises a snubber circuit. The snubber circuit comprises a second inductor 21 connected between the first connection point P1 and the first diode 14, a resistor 23 connected between the first connection point P1 and a second connection point P2, a second diode 24 connected in parallel to the resistor 23, and a condenser 22 connected between the second connection point P2 and the positive terminal (−) of each of the portions $V_i$ and $V_o$.

Turning again to FIG. 1, if the switching device 13 is turned on while a current passes through the first diode 14, a very large reverse recovery current flows through the switching device 13 for a reverse recovery time. Then, due to the high large reverse recovery current, the switching device 13 inevitably becomes damaged and also energy loss of the boost converter is increased. Thus, the boost converter shown in FIG. 2 further comprises the inductor 21 capable of suppressing the reverse recovery current owing to the inductance 21 connected between the first inductance 12 and the first diode 14.

On the other hand, when the switching device 13 is turned off, the magnitude of a current flowing through the current suppressing inductor 21 can be reduced and thereby an excessive voltage is applied to both terminals of the switching device 13. Thus, to prevent occurrence of the excessive voltage at both terminals of the switching device 13, the boost converter further comprises the resistor 23 and second diode 24 which are connected in parallel between the points P1 and P2, and the condenser 22 which is connected between the second point P2 and the negative terminal (−) of the output portion $V_o$, as shown in FIG. 2.

As described above, the prior art boost converter shown in FIG. 2 has the snubber circuit to absorb a stress energy such as an excessive voltage stress or an excessive current stress. For example, the current suppressing inductor 21 in the snubber circuit is capable of absorbing a stress energy occurring upon the switching device 13 being turned on, and the condenser 22 is capable of absorbing a stress energy occurring upon the switching device 13 being turned off. Also, if the switching device 13 is again turned on, the stress energy absorbed in the condenser 22 is discharged through the resistor 23.

However, since the absorbed stress energy in the condenser 22 is discharged as a thermal energy through the resistor 23, there are two problems in the prior art boost converter using a snubber circuit, one is allowing the total energy transfer efficiency thereof to be reduced, and the other is needing an additional circuit for preventing the discharging thermal energy from negatively affecting the other circuit elements in the boost converter.

SUMMARY OF THE INVENTION

It is an object of the present invention to provide a boost converter using a snubber circuit which is capable of absorbing stress energy and re-releasing it by an LC resonance circuit therein.

According to the present invention, the boost converter comprises a first inductor connected between one terminal of an input portion for receiving an input signal and a first connection point, a first diode connected between said first connection point and one terminal of an output portion, and a switching device connected between said first connection point and the other terminal of said input portion, the other terminal of said input portion being connected to the other terminal of said output portion. The boost converter further comprises a second inductor connected between said first connection point and an anode of said first diode; a capacitor connected between said first connection point and a second connection point, for serving as a resonant capacitor; a second diode having an anode connected to said second connection point and a cathode connected to a cathode of said first diode; and a third inductor and a third diode connected in series between said second connection point and the other terminal of said input portion, said third inductor having one terminal connected to said second connection point and the other terminal connected to a third connection point, for serving as a resonant inductor, and said third diode having a cathode connected to said third connection point and an anode connected to the other terminal of said input portion.

BRIEF DESCRIPTION OF THE DRAWINGS

This invention may be better understood and its object will become apparent to those skilled in the art by reference to the accompanying drawings as follows:

FIGS. 4A through 4D are circuit diagrams showing the operations of the boost converter of FIG. 3 when a switching device embodied therein is turned on;

DESCRIPTION OF THE PREFERRED EMBODIMENT(S)

Figure 3:
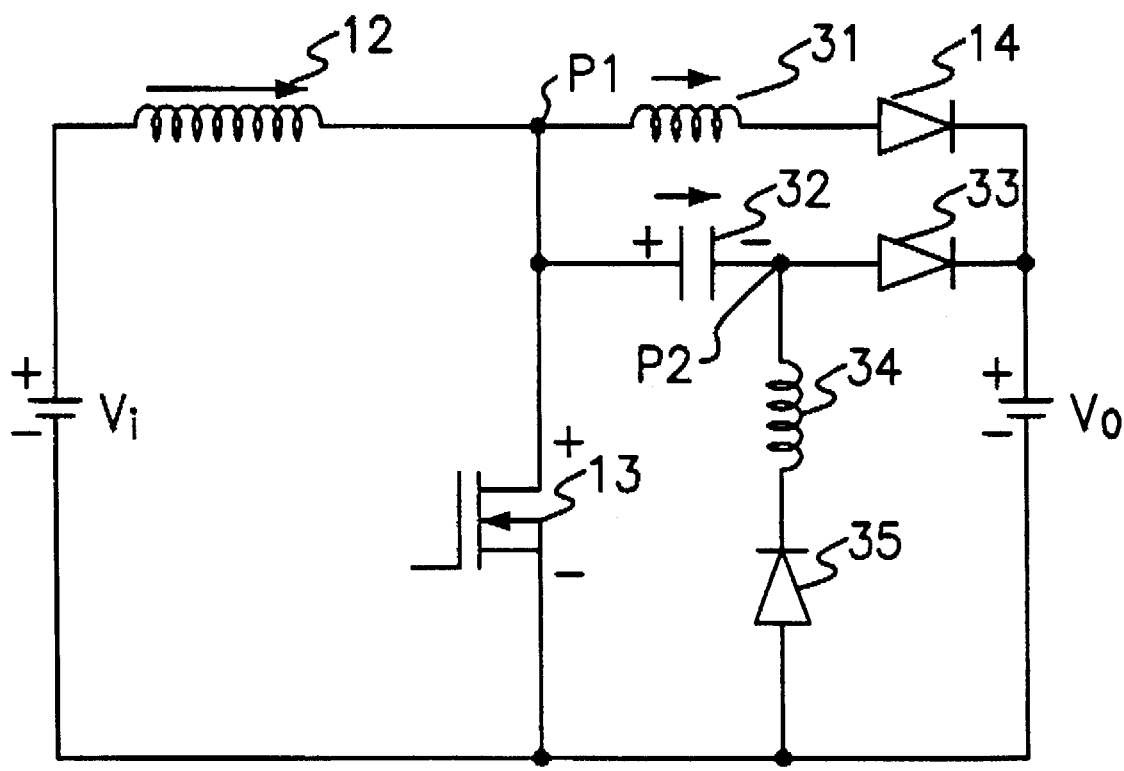
FIG. 3 is a circuit diagram showing the construction of a boost converter using a snubber circuit according to the present invention.

FIG. 3 shows the novel boost converter using an energy reproducing snubber circuit in accordance with the present invention. In the boost converter, the same components as those of FIG. 1 are indicated by the same reference numerals.

Figure 1:
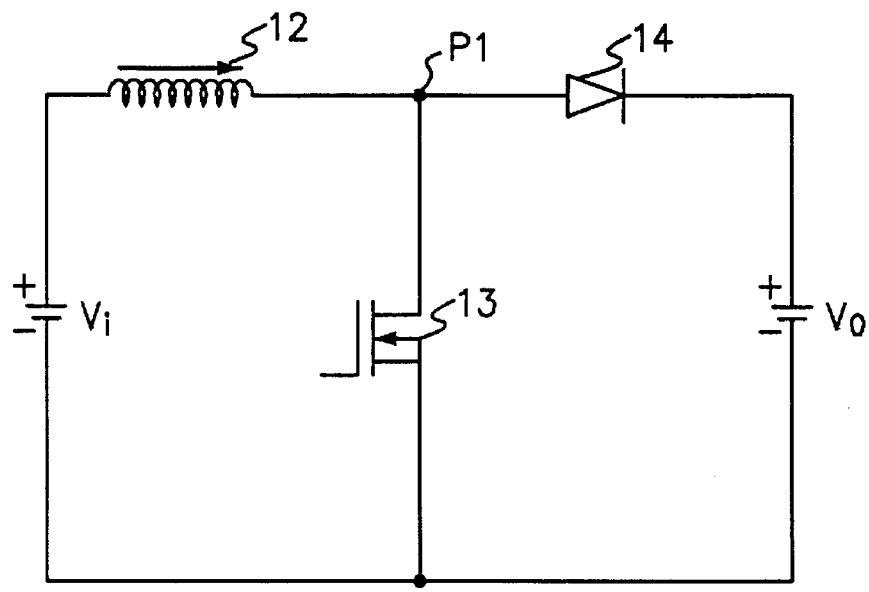
FIG. 1 is a circuit diagram showing the construction of a prior art boost converter.
Figure 2:
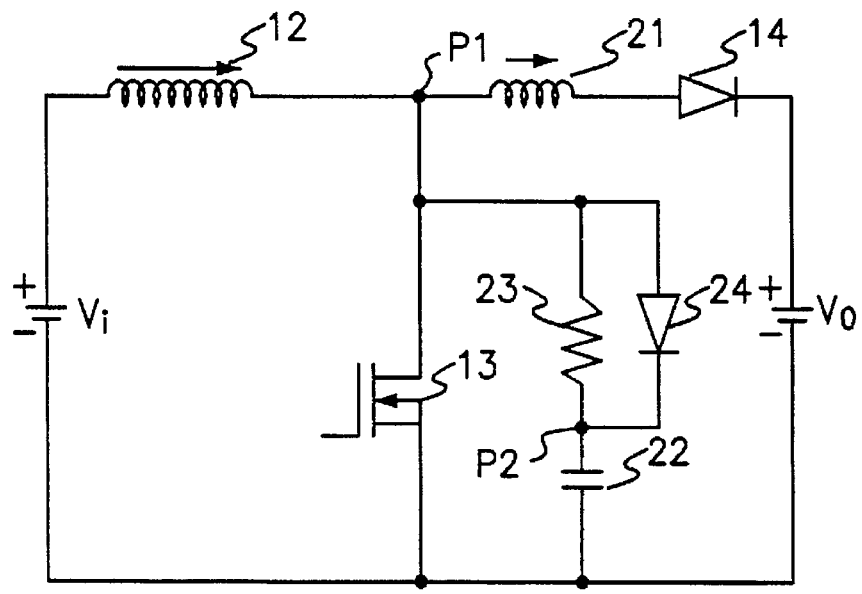
FIG. 2 is a circuit diagram showing the construction of another prior art boost converter using a snubber circuit.

Referring to FIG. 3, the novel boost converter has the same construction as that of FIG. 1 except that it further comprises a snubber circuit having a different construction from the snubber circuit of the prior art boost converter shown in FIG. 2.

The boost converter according to the present invention, as shown in FIG. 3, comprises a first inductor 12 connected between one terminal (+) of an input portion $V_i$ for receiving an input signal and a first connection point P1, a first diode 14 connected between the first connection point P1 and one terminal (+) of an output portion $V_o$, and a switching device 13 connected between the first connection point P1 and the other terminal (−) of the input portion $V_i$, the other terminal (−) of the input portion being connected to the other terminal (−) of the output portion. The boost converter further comprises a second inductor 31 connected between the first connection point P1 and an anode of the first diode 14, a resonant capacitor 32 connected between the first connection point P1 and the second connection point P2, a second diode 33 connected between the second connection point P2 and a cathode of the first diode 14, a third inductor 34 and a third diode 35 which are connected in series between the second connection point P2 and the other terminal (−) of the input portion $V_i$. The third inductor 34 is connected between the point P2 and the anode of the third diode 35 and serves as a resonant inductor. For example, the capacitor 32 and the third inductor 34 constitute an LC resonance circuit.

Figure 4A:
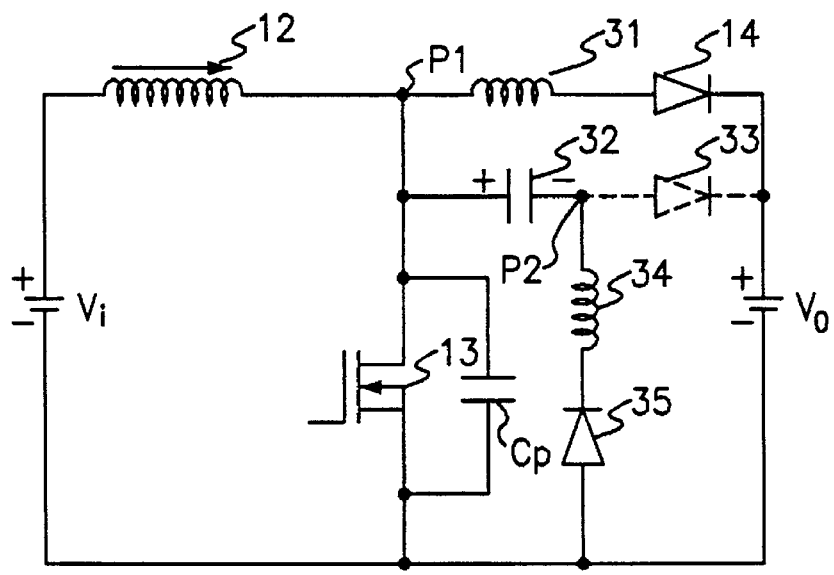
Figure 4B:
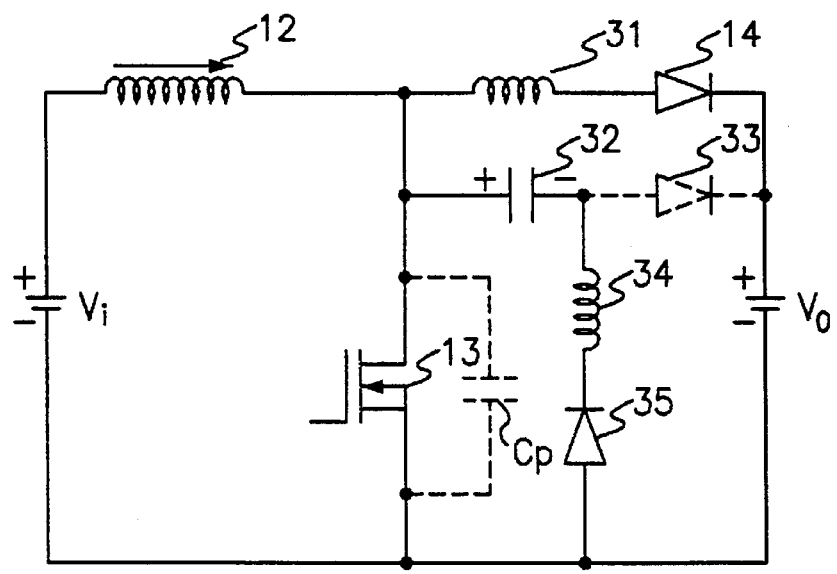

Hereinafter, the operation of the boost converter is described with reference to FIGS. 4A through 4D and FIGS. 5A through 5E. In those figures, portions shown in a dotted line mean that a current does not flow through the dotted line. FIGS. 4A through 4D show circuit operations when the switching device 13 of the boost converter is turned on. Referring to FIGS. 4A through 4D, if an input signal from the input portion $V_i$ passes through the first inductor 12, the second inductor 31 and the first diode 14, an output signal is generated from the output portion $V_o$. At this state, when the switching device 13 is turned on, a parasitic capacitance $C_p$ occurring at both terminals of the switching device 13 is discharged, as shown in FIG. 4A. The current flowing through the first inductor 12 is then divided into first and second current signals at the first connection point P1, as shown in FIG. 4B. The first current signal flows through the second inductor 31 to the first diode 14 to form a first loop, and the second current signal flows through the switching device 13 to the terminal (−) of the output portion $V_o$ to form a second loop.

Figure 4C:
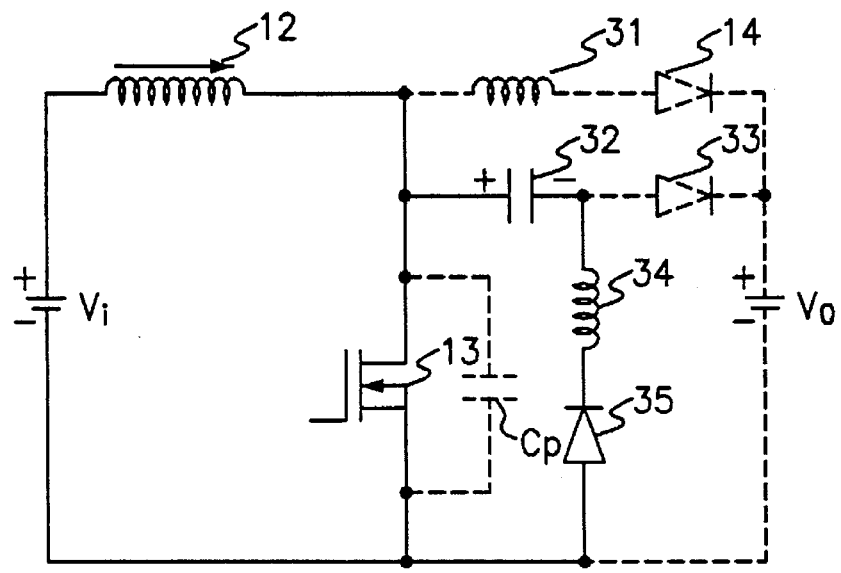

In the first loop, the magnitude of the first current signal flowing through the second inductor 31 is suddenly lowered, and a resonance between the resonant capacitor 32 and the third inductor 34 is started. If the magnitude of the current signal flowing through the second inductor 31 becomes zero, the resonance is caused through the resonance circuit consisting of the capacitor 32 and the third inductor 34, as shown in FIG. 4C. As a result, a sine wave resonance current flows between resonant capacitor 32 and the third inductor 34.

Figure 4D:
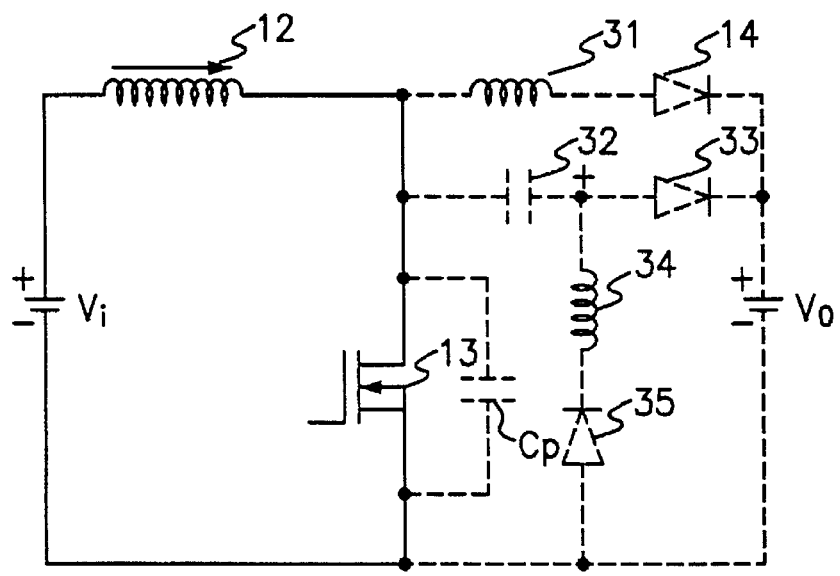

If a resonance corresponding to a half sine wave cycle is completed and the resonance current becomes zero, the charging operation of the resonant capacitor 32 is completed and then a loop is formed in which a current signal from the input portion $V_i$ flows through the first inductor 12 to the switching device 13, as shown in FIG. 4D.

FIGS. 5A through 5E show circuit operations when the switching device 13 is turned off.

Figure 5A:
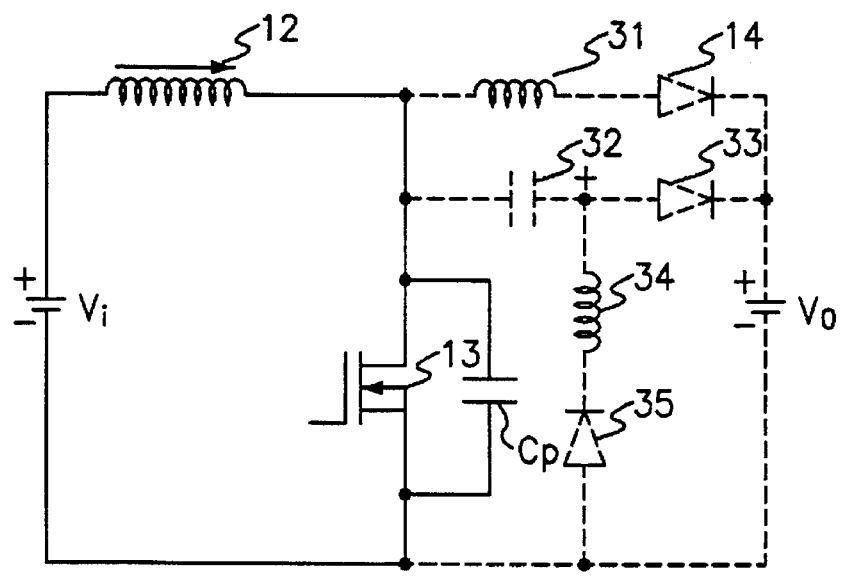
FIGS. 5A through 5E are circuit diagrams showing the operations of the boost converter of FIG. 3 when the switching device is turned off.
Figure 5B:
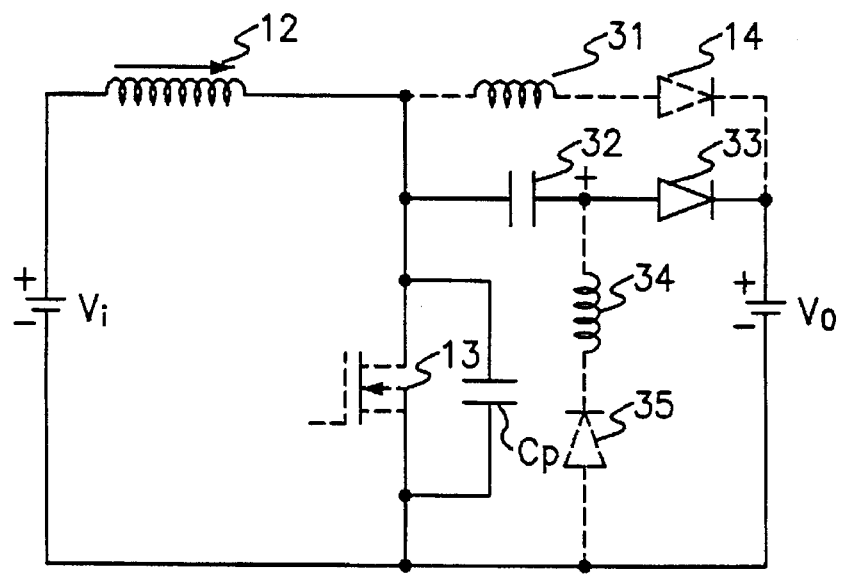

Referring to FIG. 5A, if the switching device 13 is turned off after formation of a loop in which an input signal from the input portion $V_i$ flows through the first inductor 12 and the switching device 13 and is fed back to the terminal (−) of the input portion, then $V_i$, the parasitic capacitor $C_p$ formed between both terminals of the switching device 13 is charged. At this state if the potential of the anode of the second diode 33 is higher than that of the output portion $V_o$, the second diode 33 conducts. A loop is formed in which a current signal from the input $V_i$ flows through the first inductor 12, the first capacitor 32 and the second diode 33, as shown in FIG. 5B. Thus, a stress energy stored in the resonant capacitor 32 can be released and provided to the output portion $V_o$.

Figure 5C:
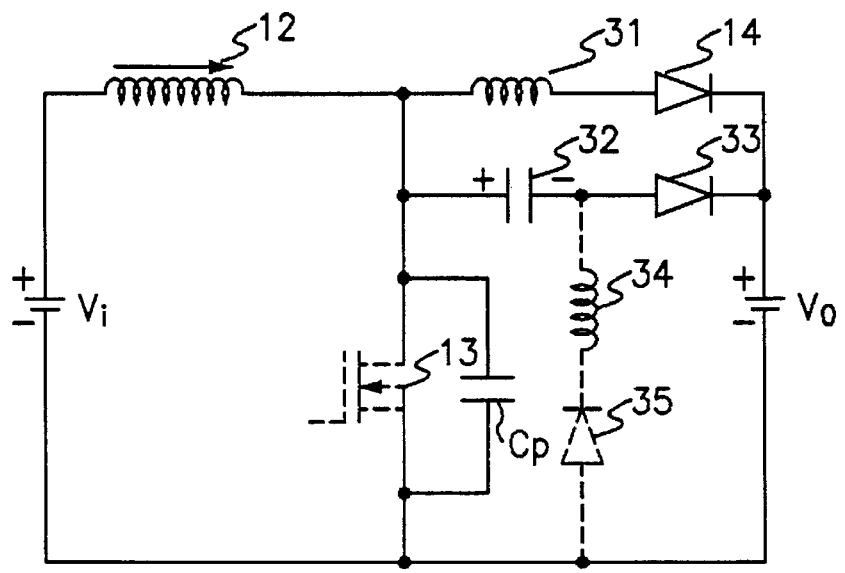
Figure 5D:
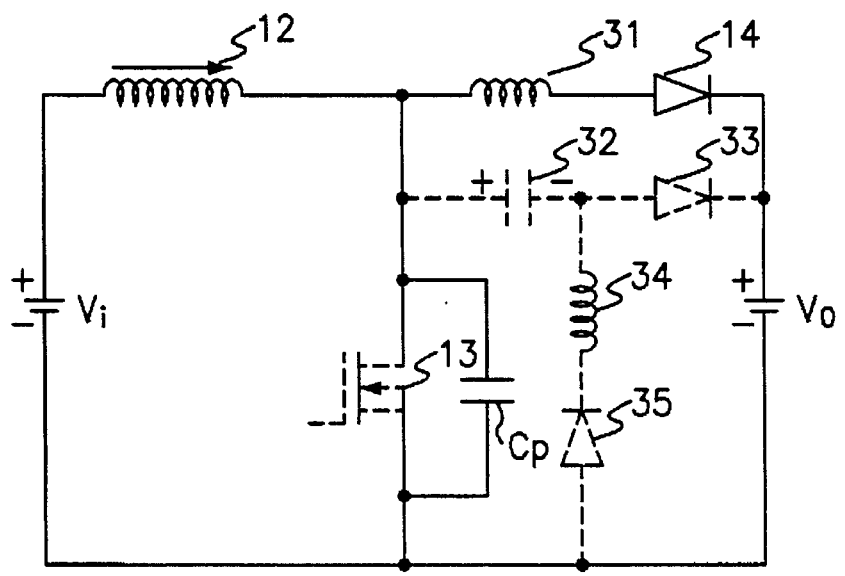
Figure 5E:
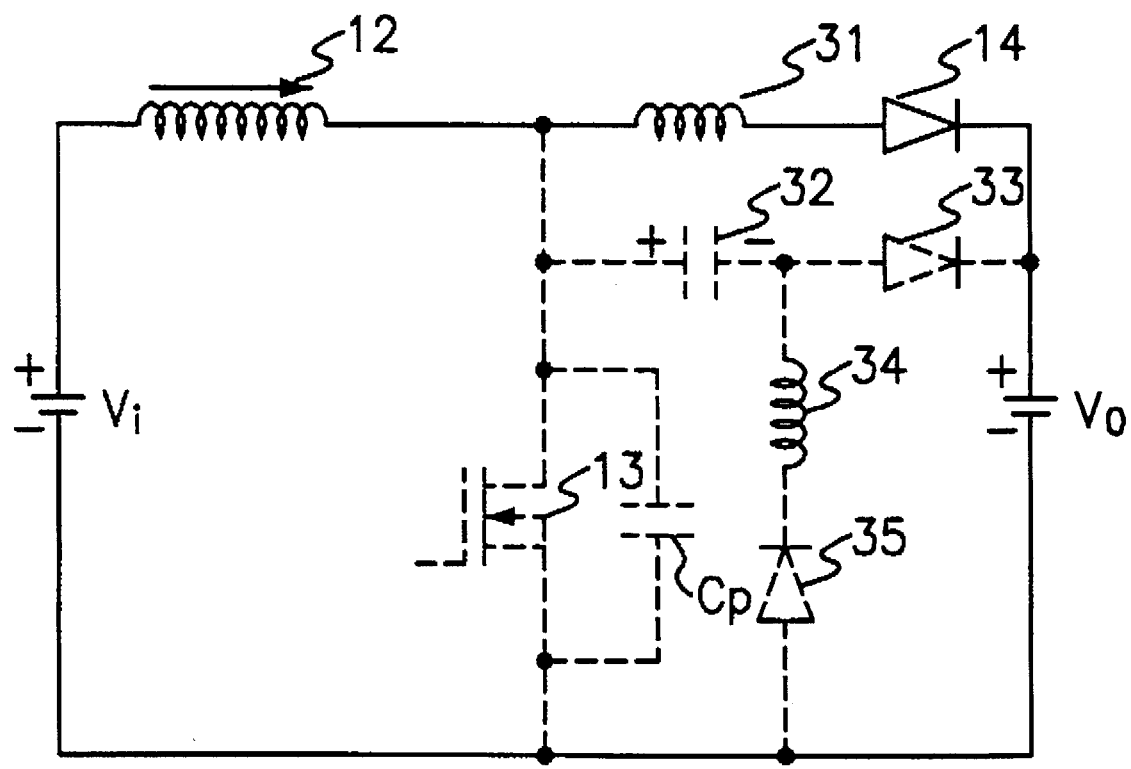

With reference to FIG. 5C, if a voltage of both terminals of the switching device 13 is more than that of the output portion $V_o$ because of voltages charged in the parasitic capacitor $C_p$ and the resonant capacitor 32, the first diode 14 conducts. Then, the magnitude of a current flowing through the second inductor 31 is suddenly increased. If the current flowing through the second inductor 31 is equal to the current flowing through the first inductor 31, the second diode 33 does not conduct and then the parasitic capacitor $C_p$ discharged, as shown in FIG. 5D. When the voltage across the parasitic capacitor $C_p$ reaches the voltage of the output portion $V_o$, a loop is formed in which the input current from the input portion $V_i$ passes through the first inductor 12 and flows from the second inductor 31 to the first diode 14, as shown in FIG. 5E.

As described above, in the case that the switching device 33 is turned off, the voltage limiting snubber circuit is constituted by the resonant capacitor 32 and the second diode 33. The voltage $V_o$ of both terminals of the switching device 13 is given by following expression:

$$V_s = V_o \pi V_c / 2$$

where $V_o$ is an output of the output portion $V_o$ and $V_c$ is a variable voltage of the resonant capacitor 32. The stress energy, which is charged in the resonant capacitor 32 when the switching device 13 is turned off, is provided to invert the polarity of the resonant capacitor 32 when the switching device 13 is turned on. Next, when the switching device 13 is again turned off, the input voltage from the input portion $V_i$ passes through the first inductor 12 and then flows from the capacitor 32 to the second diode 33. Therefore, the above described cycle is continuously repeated in which the stress energy is reproduced to be provided to the output portion $V_o$.

Figure 6A:
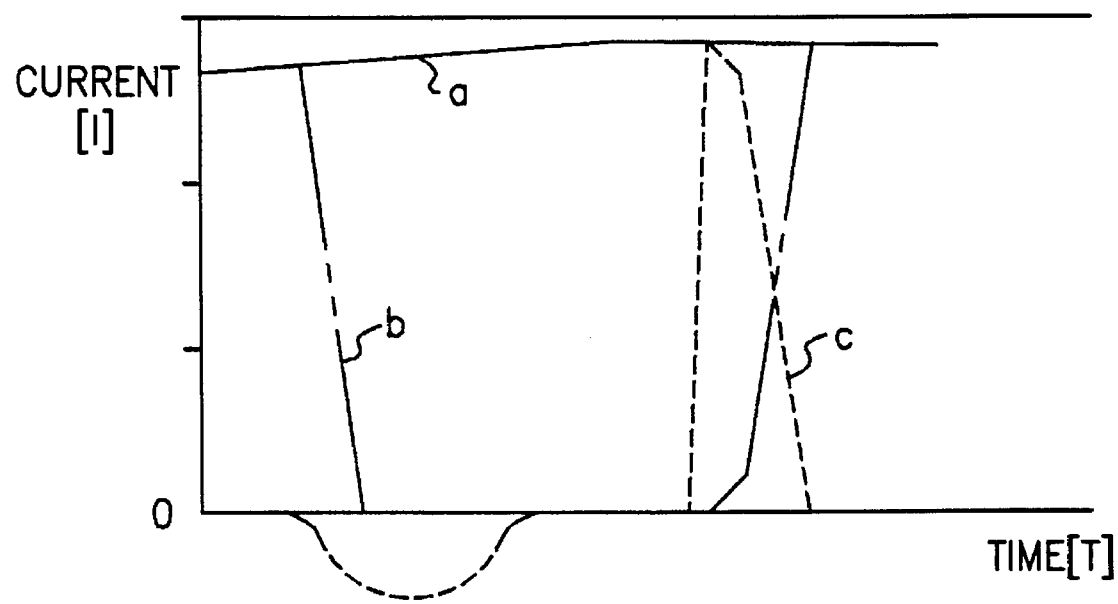
FIGS. 6A and 6B are graphs showing waveforms of various operating characteristics of the boost converter of FIG. 3.

With reference to FIG. 6A, the x-axis in a coordinate system represents time and the y-axis represents the current. In FIG. 6A, a solid line (a) shows the waveform of current flowing through the first inductor 12 in accordance with turning on/off of the switching device 13, a two-dot broken line (b) shows the waveform of a current flowing through the second inductor 31 in accordance with turning on/off of the switching device 13, and a dotted line (c) shows the waveform of a current flowing through the resonant capacitor 32 when the capacitor 32 is charged or discharged in accordance with the switching device 13.

Figure 6B:
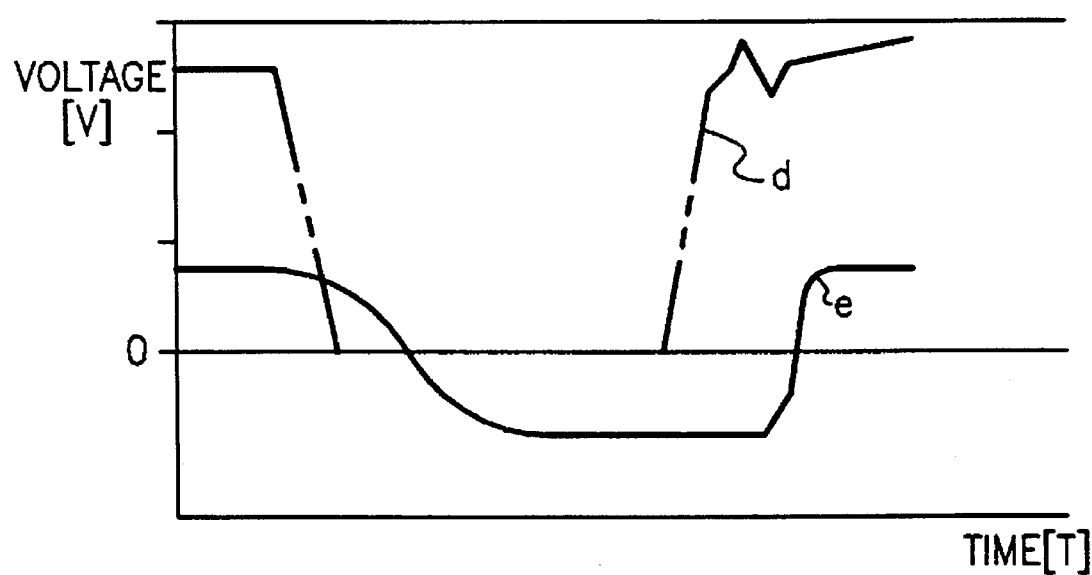

Also, in FIG. 6B, the x-axis in a coordinate system represents time and, the y-axis therein represents a voltage. The two-dot broken line (d) shows the waveform of a voltage between both terminals of the switching device 13, and the solid line (e) shows the waveform of a voltage of the resonant capacitor 32, as shown in FIG. 6B.

As above described according to the present invention, the snubber circuit, which is embodied in the boost converter, is capable of absorbing a stress energy occurring upon a switching device to be switched and the absorbed stress energy can be reproduced as an output power through an LC resonance circuit. Therefore, an efficiency of the boost converter can be significantly improved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A boost converter having a first inductor connected between one terminal of an input portion for receiving an input signal and a first connection point, a first diode connected between said first connection point and one terminal of an output portion, and a switching device connected between said first connection point and the other terminal of said input portion, the other terminal of said input portion being connected to the other terminal of said output portion, said boost converter comprising:
    a second inductor connected between said first connection point and an anode of said first diode; and
    an unswitched resonant portion, comprising
        a capacitor connected between said first connection point and a second connection point, for serving as a resonant capacitor;
        a second diode having an anode connected to said second connection point and a cathode connected to a cathode of said first diode; and
        a third inductor and a third diode connected in series between said second connection point and the other terminal of said input portion, said third inductor having one terminal connected to said second connection point and a second terminal connected to a third connection point, for serving as a resonant inductor, and said third diode having a cathode connected to said third connection point and an anode connected to the other terminal of said input portion.

2. A boost converter, comprising:
    an input having first and second input terminals;
    an output having first and second output terminals, said second output terminal connected to said second input terminal;
    a first inductor connected between said first input terminal and a first connection point;
    a first diode connected between said first connection point and said first output terminal, said first diode having a first orientation relative to said first output terminal;
    a second inductor connected between said first connection point and said first diode;
    a switching device connected between said first connection point and said second input terminal; and
    an unswitched resonant portion, comprising
        a capacitor connected between said first connection point and a second connection point;
        a second diode connected between said second connection point and said first output terminal, said second diode having a second orientation relative to said first output terminal the same as said first orientation; and
        a third inductor and a third diode connected in series between said second connection point and said second input terminal, said third inductor connected between said second connection point a third connection point, for serving as a resonant inductor, and said third diode being connected between said third connection point and said second input terminal.

3. A boost converter, comprising:
    an input having first and second input terminals;
    an output having first and second output terminals, said second output terminal connected to said second input terminal;
    a first inductor connected between said first input terminal and a first connection point;
    a first diode connected between said first connection point and said first output terminal, said first diode having a first orientation relative to said first output terminal;
    a second inductor connected between said first connection point and said first diode;
    a switching device connected between said first connection point and said second input terminal; and
    an unswitched resonant portion, consisting
        a capacitor connected between said first connection point and a second connection point;
        a second diode connected between said second connection point and said first output terminal, said second diode having a second orientation relative to said first output terminal the same as said first orientation; and
        a third inductor and a third diode connected in series between said second connection point and said second input terminal, said third inductor connected between said second connection point a third connection point, for serving as a resonant inductor, and said third diode being connected between said third connection point and said second input terminal.

* * * * *